United States Patent
Najafi et al.

(10) Patent No.: US 10,454,014 B2
(45) Date of Patent: Oct. 22, 2019

(54) DIODE DEVICES BASED ON SUPERCONDUCTIVITY

(71) Applicant: PSIQUANTUM CORP, Palo Alto, CA (US)

(72) Inventors: Faraz Najafi, Palo Alto, CA (US); Syrus Ziai, Palo Alto, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

(21) Appl. No.: 16/182,513

(22) Filed: Nov. 6, 2018

(65) Prior Publication Data

US 2019/0140157 A1    May 9, 2019

Related U.S. Application Data

(60) Provisional application No. 62/582,789, filed on Nov. 7, 2017.

(51) Int. Cl.
| | |
|---|---|
| *H01L 39/08* | (2006.01) |
| *H01L 39/14* | (2006.01) |
| *H01L 29/861* | (2006.01) |
| *H01L 39/24* | (2006.01) |
| *H01L 39/06* | (2006.01) |

(52) U.S. Cl.
CPC ............ *H01L 39/08* (2013.01); *H01L 29/861* (2013.01); *H01L 39/06* (2013.01); *H01L 39/14* (2013.01); *H01L 39/24* (2013.01)

(58) Field of Classification Search
CPC combination set(s) only.
See application file for complete search history.

(56) References Cited

U.S. PATENT DOCUMENTS

2010/0102904 A1* 4/2010 Kusmartsev .......... H01L 39/223
                                                         333/24 R

* cited by examiner

*Primary Examiner* — Matthew L Reames
(74) *Attorney, Agent, or Firm* — Morgan, Lewis & Bockius LLP (57) ABSTRACT

An electronic device (e.g., a diode) is provided that includes a substrate and a patterned layer of superconducting material disposed over the substrate. The patterned layer forms a first electrode, a second electrode, and a loop coupling the first electrode with the second electrode by a first channel and a second channel. The first channel and the second channel have different minimum widths. The device further includes a magnet that applies a magnetic field to the loop, which produces an expulsion current in the loop that travels toward the second electrode in the first channel and toward the first electrode in the second channel. For a range of current magnitudes, when the magnetic field is applied to the patterned layer of superconducting material, the conductance from the first electrode to the second electrode is greater than the conductance from the second electrode to the first electrode.

17 Claims, 6 Drawing Sheets

DIODE DEVICES BASED ON SUPERCONDUCTIVITY

RELATED APPLICATIONS

This application claims priority to U.S. Provisional Patent Application 62/582,789, filed on Nov. 7, 2017, entitled "Diode Devices Based on Superconductivity," which is hereby incorporated by reference in its entirety.

TECHNICAL FIELD

This relates generally to electronic devices (e.g., diodes) having an asymmetric conductance between terminals and, more specifically, to diodes that operate based on the properties of superconducting materials.

BACKGROUND

In electrical circuits, there is often a need for allowing electric current to flow in one direction but not the other. Diodes provide this functionality and are ubiquitous in modern electronics. A diode commonly refers to a two-terminal electronic component that conducts primarily in one direction (e.g., has an asymmetric conductance between the two terminals, often referred to as electrodes). Over the years, diodes have taken a variety of forms, from thermionic diodes (based on vacuum tubes) to semiconductor-based diodes using point contacts or n-p junctions.

However, conventional diodes, even in the high conductance direction, have non-zero resistances. Thus, applications of conventional diodes have been limited.

SUMMARY

Accordingly, there are needs for diodes that have zero resistance in the high conductance direction. The present disclosure provides thin film diode devices based on superconducting materials, thereby utilizing advantages of superconducting materials (e.g., zero resistance under certain conditions). In addition, diodes that are superconducting can be integrated more easily (e.g., monolithically) with other superconducting components in circuits and devices. Such circuits and devices are often used for making sensitive measurements. For example, superconducting circuits play a critical role in superconducting quantum interference devices (SQUIDs). Superconducting components also play an important role in sensitive optical measurements. For these purposes, there is a need for diodes whose operating principles are based on the properties of superconducting materials.

In accordance with some embodiments, an electronic device (e.g., a diode device) is provided that includes a substrate and a patterned layer of superconducting material disposed over the substrate. The patterned layer forms a first electrode, a second electrode, and a loop coupling the first electrode with the second electrode by a first channel and a second channel. The first channel has a first minimum width and the second channel has a second minimum width that is distinct from the first minimum width. The electronic device further includes a magnet configured to apply a magnetic field to the loop in the patterned layer of superconducting material. The magnetic field produces an expulsion current in the loop that travels toward the second electrode in the first channel and toward the first electrode in the second channel. For a range of current magnitudes, when the magnetic field is applied to the patterned layer of superconducting material, the conductance from the first electrode to the second electrode is greater than the conductance from the second electrode to the first electrode.

Additionally, the present disclosure provides a method of using a thin film diode device based on superconducting materials. The method includes obtaining an electrical device that includes a substrate and a patterned layer of superconducting material disposed over the substrate. The patterned layer forms a first electrode, a second electrode, and a loop coupling the first electrode with the second electrode by a first channel and a second channel. The first channel has a first minimum width and the second channel has a second minimum width that is distinct from the first minimum width. The method further includes applying a magnetic field over the loop in the patterned layer of superconducting material. The method further includes, while the magnetic field is applied over the loop: applying a first current from the first electrode to the second electrode, whereby the superconducting material in the loop remains in a superconducting state; and applying the first current from the second electrode to the first electrode, whereby the superconducting material in the loop transitions into a non-superconducting state.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

DETAILED DESCRIPTION

The diodes described herein operate based on particular properties of superconducting materials, namely that superconducting materials becoming resistive (e.g., non-superconductive) under certain conditions. For example, a superconducting material superconducts (e.g., have zero electrical resistance) only below a particular temperature (called the material's critical temperature) (e.g., the superconducting material is in a superconducting state having zero electrical resistance only below the particular temperature). This temperature is specific to the particular superconducting material and varies with the ambient pressure. For example, at one atmosphere of pressure (e.g., 101 kPa), niobium (Nb) superconducts below 9.26 kelvin while niobium oxide (NbO) superconducts below 1.38 kelvin. In addition, superconducting materials can support only a limited density of electrical current before transitioning to a resistive state. The limit on the amount of current density that the superconducting material can support before becoming resistive is called the critical current density. For example, a superconducting material conducts a current having a current density below the critical current density with no electrical resistance (e.g., at a temperature below the superconducting material's critical temperature) and the superconducting material conducts a current having a current density above the critical current density with non-zero electrical resistance (e.g., even at a temperature below the superconducting material's critical temperature). The critical current density is also specific to the material and dependent on the ambient pressure.

Another property of superconductors is that a superconducting material in a superconducting state expels an applied magnetic field. For example, when a magnetic field is applied over a loop (e.g., a superconducting wire having a loop shape), a loop of current (called expulsion or screening current) is established in the superconducting material in response to the applied magnetic field. The current loop creates a magnetic field that is opposite the applied magnetic field and the created magnetic field cancels out the applied magnetic field.

The devices described herein take advantage of these effects. In particular, the present disclosure provides a diode (e.g., a thin film diode) that operates based on superconductivity. The diode includes a layer of superconducting material deposited and patterned on a substrate. The pattern forms two electrodes (e.g., wires of superconducting material) and a loop of superconducting material coupling the two electrodes. A magnet applies a magnetic field to the loop, resulting in an expulsion current that circles the loop. Because of the loop structure, the expulsion current travels toward one electrode (e.g., the anode) on one side of the loop, and toward the other electrode (e.g., the cathode) on the other side of the loop. When a current is applied between the two electrodes, the applied current acts in conjunction with the expulsion current. That is, the applied current adds to the expulsion current in one channel and subtracts from the expulsion current in the other channel.

By making the loop asymmetric so that one side of the loop (e.g., one channel) is thinner than the other (e.g., a first side of the loop has a minimum width that is greater than a minimum width of a second side of the loop), the device can have an asymmetric conductance (e.g., while a magnetic field is applied). While a magnetic field is applied over the loop, the current density in an asymmetric loop is high when the applied current travels in the same direction as the expulsion current in the narrow channel (e.g., if the same magnitude current were applied in the opposite direction, it would add to the expulsion current in the wider channel and the resulting current density would not be as high, because the width of the wider channel is greater than the width of the narrow channel). Thus, for at least some magnitudes of applied current, when the current is applied in one direction, a current density in the narrow channel exceeds the critical current density. When the current density in the narrow channel exceeds the critical current density, the narrow channel transitions to a resistive (non-superconducting) state. In some embodiments, when the narrow channel transitions to a resistive (non-superconducting) state, a redistribution of the current also causes the current density in the wide channel to exceed the critical current density, causing the wide channel to transition to a resistive state as well. This is referred to herein as an avalanche effect. When the same current magnitude is applied in the opposite direction, the current density in the narrow channel does not exceed the critical current density and the narrow channel remains in a superconducting state. Because the device transitions to a resistive state when a current is applied in one direction (e.g., both channels transition to a resistive state when a current is applied in one direction), but remains superconducting when the same current is applied in the opposite direction (for at least certain current magnitudes), the electrical conductance from the first electrode to the second electrode is greater than the electrical conductance from the second electrode to the first electrode. Thus, the device has an asymmetric conductance between the first electrode and the second electrode.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Figures 1A, 1B:
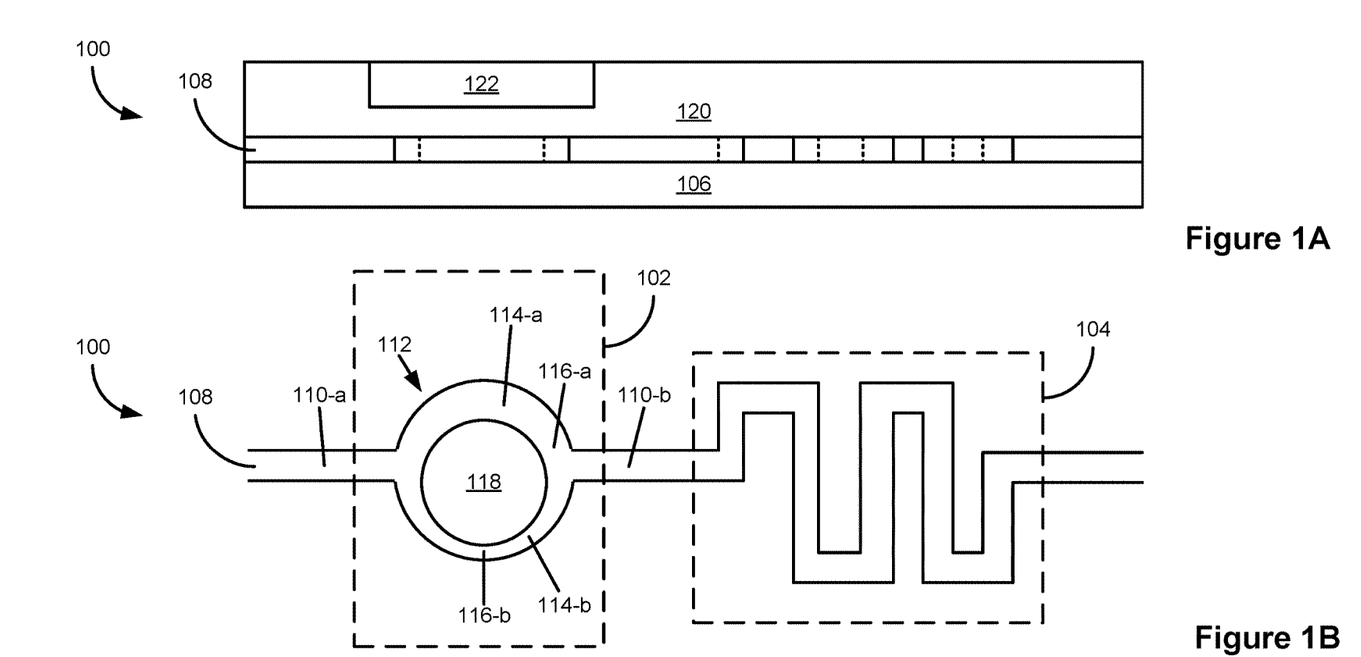
FIG. 1A is a front view of a portion of an electronic device (e.g., a superconducting diode device) in accordance with some embodiments.
FIG. 1B is a plan view of the portion of the electronic device shown in FIG. 1A.
Figure 1C:
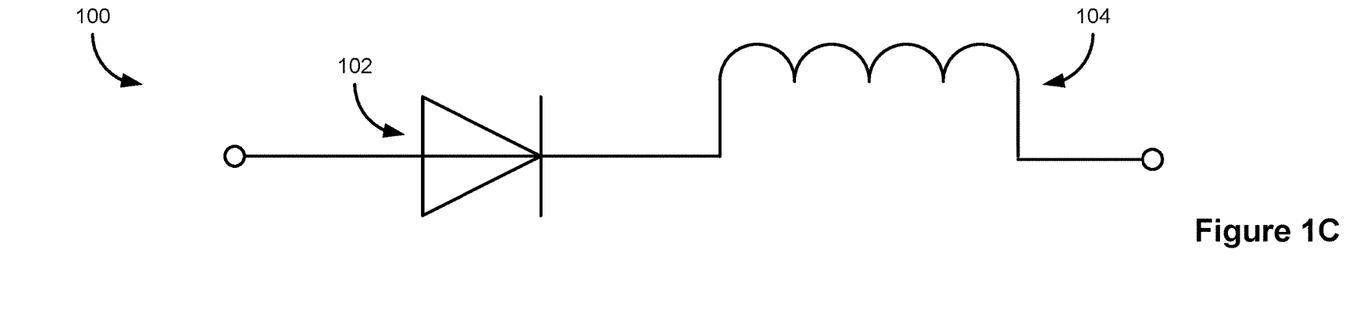
FIG. 1C illustrates an equivalent circuit that corresponds to the portion of the electronic device shown in FIGS. 1A and 1B.

FIGS. 1A-1B illustrate a front view and a plan view of a portion of an electronic device 100, respectively, in accordance with some embodiments. For visual clarity, magnet 122 (shown in FIG. 1A and discussed below) is excluded from the top-down view shown in FIG. 1B. FIG. 1C illustrates a circuit equivalent of electronic device 100, in accordance with some embodiments. In some embodiments, electronic device 100 includes a diode 102 (e.g., a thin film diode) and an inductive element 104 (e.g., an inductor). In some embodiments, diode 102 is a two-terminal electronic component that conducts primarily in one direction (e.g., has an asymmetric conductance between the two terminals, often referred to as a first electrode and a second electrode).

In some embodiments, inductive element 104 has a pre-selected, or designed-for, inductance (e.g., as opposed to merely having an inherent inductance, which is a natural property of circuit components, including wires). For example, patterned layer of superconducting material 108 is patterned such that the shape of the inductive element 104 (e.g., a squiggly shape) results in a desired inductance. As explained with reference to FIG. 4, in some cases, inductive element 104 assures that the current traveling through diode 102 does not change too quickly by, for example, getting re-directed through a low-impedance portion of a circuit coupled with diode 102.

In some embodiments, electronic device 100 is a portion of a superconducting circuit (e.g., electronic device 100 is electrically coupled with other components to form a circuit). For example, electronic device 100 may be incorporated (e.g., monolithically integrated) into a larger electronic device or superconducting circuit. Thus, electronic device 100 may form a portion or a component of a larger electronic device or superconducting circuit.

As used herein, the term "superconducting circuit" means a circuit for which some aspect of the circuit's functionality relies on the superconducting properties of superconducting materials. In some embodiments, a superconducting circuit includes a superconducting material.

As used herein, the term "superconducting material" means a material that exhibits superconducting behavior under certain conditions (e.g., temperature, pressure, magnetic, and current density conditions). When those conditions are met, the superconducting material is said to be in a superconducting state. For example, a superconducting material is a material that operates as a superconductor (e.g., operates with zero electrical resistance) when cooled below a particular temperature (called the critical temperature) and having less than a threshold current density flowing through it (called the critical current density). Depending on the conditions, a superconducting material may also be in a resistive, or non-superconducting, state (e.g., a state in which the material has a non-zero electrical resistance). For example, a superconducting material supplied with a current that exceeds the critical current density for the superconducting material transitions from a superconducting state having zero electrical resistance to a non-superconducting state having non-zero electrical resistance. Thus, as used herein, a superconducting material is one that is capable of superconducting under the right conditions, but need not always be superconducting.

Returning to FIGS. 1A-1C, device 100 includes a substrate 106 (e.g., a silicon substrate, a quartz substrate, or any other suitable substrate). In some embodiments, some or all of the remaining components of device 100 are fabricated upon (e.g., monolithically integrated with) substrate 106. For example, device 100 includes a patterned layer of superconducting material 108 disposed over the substrate (e.g., directly on substrate 106 or with one or more intervening layers between substrate 106 and the layer of superconducting material 108). The patterned layer of superconducting material 108 can be formed by depositing the layer of the superconducting material (e.g., niobium, niobium oxide, etc.) using a standard deposition technique (e.g., magnetron sputtering) and then patterning the deposited layer of superconducting material using optical or e-beam lithography techniques.

The patterned layer of superconducting material 108 forms a first electrode 110-a (e.g., an anode) and a second electrode 110-b (e.g., a cathode). In some embodiments, first electrode 110-a and second electrode 110-b are superconducting wires having widths in the range of tens of nanometers or hundreds of nanometers. As used herein, a "wire" is a section of material configured for transferring electrical current. In some implementations, a wire includes a section of material conditionally capable of transferring electrical current (e.g., a wire made of a superconducting material that is capable of transferring electrical current while the wire is maintained at a temperature below a critical temperature). Thus, in the context of an integrated circuit, a wire can be a patterned strip of a deposited conductive layer (e.g., a layer that conducts at least under certain conditions).

The patterned layer of superconducting material 108 forms a loop 112 coupling first electrode 110-a with second electrode 110-b by a first channel 114-a and a second channel 114-b. First channel 114-a has a first minimum width (shown at location 116-a) and second channel 114-b has a second minimum width (shown at location 116-b) that is distinct from the first minimum width (e.g., the first minimum width is greater than the second minimum width).

As used herein, a loop has any shape with two separate, connected, channels. The term loop is not meant to imply any particular shape (e.g., a loop is not limited to a circular loop). As discussed below, the loop can have a circular outer perimeter, an oblong outer perimeter, or a rectangular outer perimeter. In some embodiments, a loop has any shape having two conductive channels surrounding an insulating center region (e.g., insulating center region 118). In some embodiments, a portion of the superconducting layer is removed from the insulating center region. In some embodiments, the insulating center region is filled with an insulating material (e.g., passive layer 120, which may cover the patterned layer of superconducting material 108 and fill in the gaps).

In some embodiments, second channel 114-b is configured (e.g., using the selection criteria, described below) to transition from a superconducting state to a resistive state upon application of a current from second electrode 110-b to first electrode 110-a, (e.g., as long as the current has a magnitude in a range of current magnitudes for which the device operates, as described below). In some embodiments, upon the application of the current from second electrode 110-b to first electrode 110-a, first channel 114-a is configured to transition to a resistive state in response to second channel 114-b transitioning to a resistive state (e.g., via a cascade effect, described below).

Electronic device 100 further includes a magnet 122 configured to apply a magnetic field to loop 112 in a patterned layer of superconducting material 108. In some embodiments, magnet 122 is a permanent magnet. In some embodiments, magnet 122 is an electromagnet. In some embodiments, magnet 122 (whether an electromagnet or permanent magnet) is fabricated on substrate 106 to form an integral part of diode 102 (e.g., magnet 122 is integrated with diode 102 on substrate 106). As used herein, the term "fabricated on" is not meant to imply direct contact between substrate 106 and magnet 122. Rather, the term "fabricated on" contemplates the possibility of one or more intervening layers between substrate 106 and magnet 122 (e.g., patterned layer of superconducting material 108 and passive layer 120). The exact ordering of layers is not necessarily important. For example, in some embodiments, a magnet is disposed directly on the substrate, followed by a passive (e.g., insulating) layer, followed by a patterned layer of superconducting material (e.g., the layer structure of electronic device 100 can be inverted). The operation of magnet 122 is described in greater detail with reference to FIG. 2.

Figure 2:
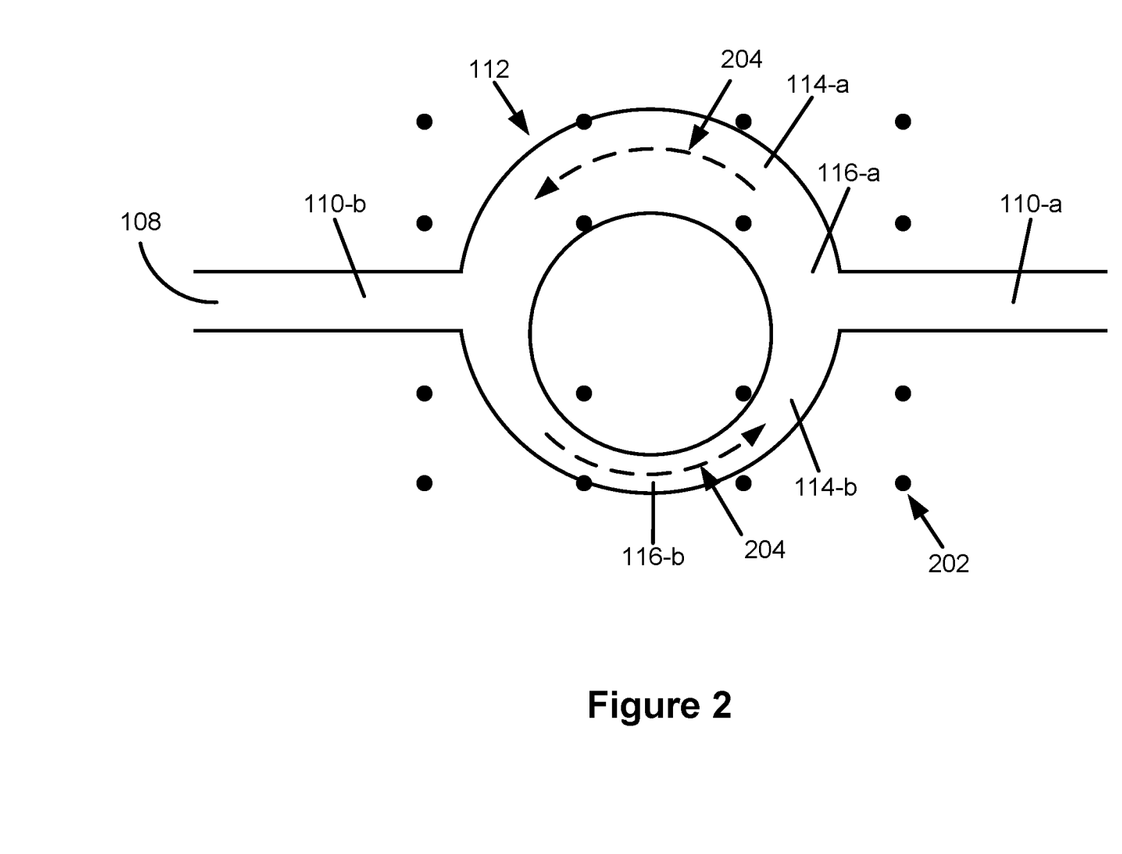
FIG. 2 illustrates a magnetic field applied to a portion of a patterned layer of superconducting material of the electronic device in accordance with some embodiments.

FIG. 2 illustrates magnetic field 202 applied to a portion of the patterned layer of superconducting material 108, in accordance with some embodiments (e.g., applied by magnet 122, FIG. 1A). In FIG. 2, magnetic field 202 represents a magnetic field that is directed into the page. Alternatively, a magnetic field that is directed out of the page may be used. As a result of the Meissner effect, when loop 112 is in a superconducting state, application of magnetic field 202 results in expulsion current $I_E$ 204 (sometimes called a screening current) around loop 112 which expels magnetic field 202 from the superconducting material. Because the expulsion current travels around loop 112 (e.g., clockwise or counter-clockwise, depending on the direction of applied magnetic field 202), expulsion current $I_E$ 204 travels from first electrode 110-a toward second electrode 110-b in first channel 114-a and from second electrode 110-b toward first electrode 110-a in second channel 114-b. In some embodiments, expulsion current $I_E$ 204 travels toward the anode (e.g., first electrode 110-a) in the narrow channel (e.g., channel 114-b), thus reducing the current density in the narrow channel when a current is applied from the anode to the cathode (e.g., second electrode 110-b), and increasing the current density in the narrow channel when a current is applied from the cathode to the anode (triggering the transition to a resistive state).

Figure 3A:
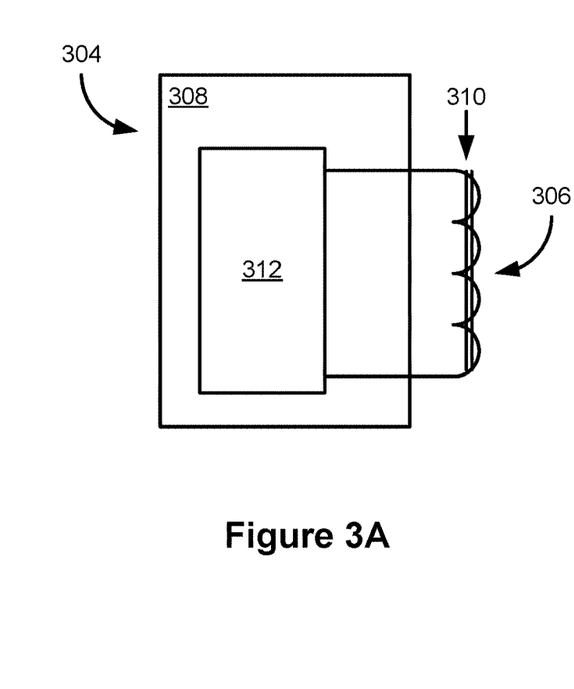
FIGS. 3A-3B illustrate magnets for applying a magnetic field to a patterned layer of superconducting material in accordance with some embodiments.
Figure 3B:
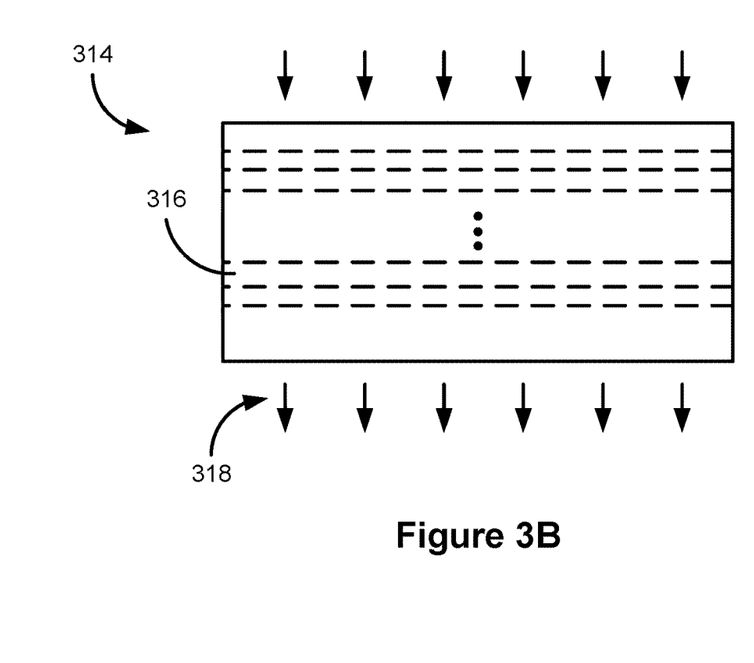

FIGS. 3A-3B illustrate magnets for applying a magnetic field to a patterned layer of superconducting material, in accordance with some embodiments. For example, magnet 122 (FIG. 1A) can be embodied as either magnet 304 (FIG. 3A) or magnet 314 (FIG. 3B).

Magnet 304 is an electromagnet, in accordance with some embodiments. As noted above, in some embodiments, magnet 304 is integrated on a substrate (e.g., substrate 106, FIG. 1A) with other diode components (e.g., patterned layer of superconducting material 108, FIGS. 1A-1B). In other embodiments, magnet 304 is separate from substrate 106. In some embodiments, electromagnet 304 includes one or more coils of wire 306 (or another wire structure designed to produce a current-based magnetic field). In some embodiments, electromagnet 304 includes magnetic core 310 to enhance the strength of the magnetic field from electromagnet 304. Electromagnet 304 further includes circuitry 308 that provides current to the one or more coils of wire 306 (e.g., current source 312 and circuitry to control current source 312). In some embodiments, the one or more coils of wire 306 are integrated on substrate 106 but circuitry 308 is separate from substrate 106.

In some embodiments, electromagnet 304 is configured to apply a tunable magnetic field (e.g., by tuning the magnitude of the current through coils of wire 306) to the patterned layer of superconducting material 108. This has the effect of tuning a range of current magnitudes for which the device operates as a diode (e.g., the range of current magnitudes for which the conductance from first electrode 110-a to second electrode 110-b is greater than the conductance from second electrode 110-b to the first electrode 110-a, or, more simply put, the range of current magnitudes for which the conductance is greater in one direction than the other). To this end, in some embodiments, current source 312 is a tunable current source and circuitry 308 includes circuitry to control the tunable current source 312.

In accordance with some embodiments, magnet 314 (illustrated in FIG. 3B) is a permanent magnet. In some embodiments, permanent magnet 314 is integrated on substrate 106. To that end, in some embodiments, magnet 314 includes one or more magnetic layers 316 deposited on (e.g., disposed over) substrate 106 (e.g., directly on substrate 106 or with one or more intervening layers between substrate 106 and the one or more magnetic layers 316). The one or more magnetic layers 316 are optionally patterned. In some embodiments, the one or more magnetic layers 316 collectively exhibit a perpendicular magnetic anisotropy (e.g., magnet 314 is a thin film magnet with perpendicular magnetic anisotropy). In such embodiments, magnetic field lines 318 emanate perpendicularly from magnet 314 and are incident perpendicularly, or substantially so, on loop 112 (FIGS. 1A-1B). For example, some nickel/cobalt and palladium/cobalt multilayer films exhibit perpendicular magnetic anisotropy. In some embodiments, magnetic field lines 318 have a component perpendicular to loop 112 (e.g., magnet 314 is has an in-plane anisotropy and is positioned with respect to loop 112 to provide field lines with a perpendicular component to a plane defined by loop 112).

Figure 4:
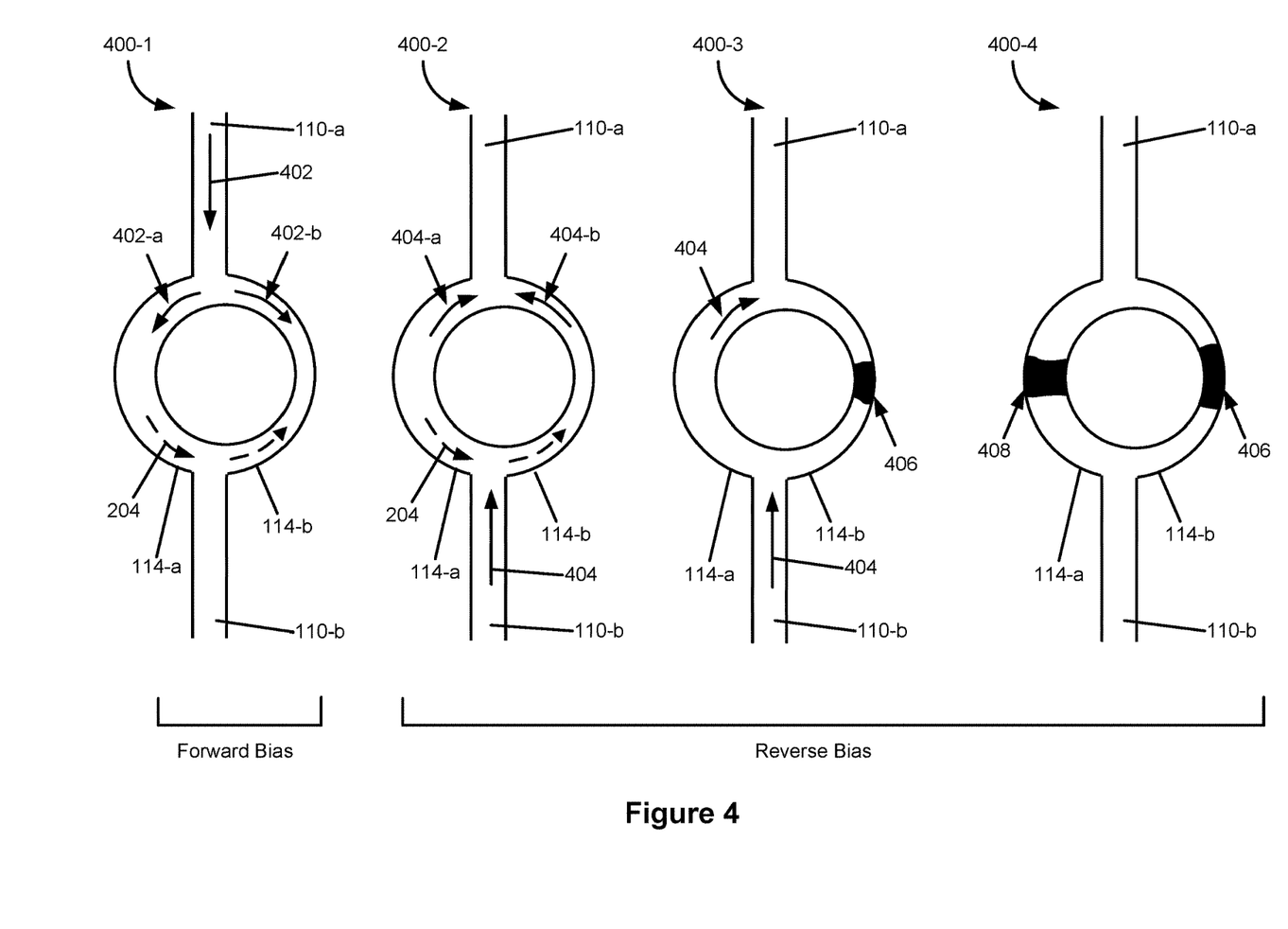
FIG. 4 illustrates the operation of a superconducting diode in accordance with some embodiments.

FIG. 4 illustrates the operation of a thin film superconducting diode through a series of frames 400, in accordance with some embodiments. In conjunction with FIG. 4, the description below provides selection criteria from which loop 112 can be designed (e.g., to produce a cascading or "avalanche" transition to a resistive state when a reverse bias current is applied). In accordance with some embodiments, the selection criteria described below use simplifying assumptions, such as that an applied current is initially distributed equally between channel 114-a and channel 114-b. The current distributions can, however, in accordance with some embodiments, be more accurately determined using any of a variety of simulation tools, thus resulting in more accurate design of loop 112. The term "selection criteria" should therefore be construed as numerically or analytically calculated design constraints on the geometry of loop 112 (e.g., taking into account one or more of: the strength of the magnetic field from magnet 122, the critical current density of the superconducting material, the critical temperature of the superconducting material, and a designed range of current magnitudes, as described below). In some embodiments, the selection criteria provide a set of suitable values for the thickness of the superconducting material as well as the minimum widths of first channel 114-a and second channel 114-b, respectively, given an applied magnetic field and the properties of the superconducting material (e.g., critical current density and critical temperature). The term "selection rule" is used below to denote analytical selection criteria (e.g., equations rather than numerical simulations) based on simplifying assumptions (e.g., toy physical models of electronic device 100).

The selection criteria are governed by a range of current magnitudes for which the device should function as a diode. The range of current magnitudes can be denoted $(I_{min}, I_{max})$. Thus, $I_{min}$ is a lower threshold current for which the device ceases to exhibit an asymmetric conductance (e.g., the threshold bias current needed to cause loop 112 to transition to a resistive state in reverse bias) and $I_{max}$ is a upper threshold current for which the device ceases to exhibit an asymmetric conductance (e.g., the threshold current that causes loop 112 to transition to a resistive state in forward bias). While a current greater than $I_{max}$ is applied to the device in either direction, the device operates in a resistive state (e.g., when a current greater than $I_{max}$ is applied to the device in forward bias, the device operates in a resistive state; and when a current greater than $I_{max}$ is applied to the device in reverse bias, the device also operates in a resistive state). While a current less than $I_{min}$ is applied to the device in either direction, the device operates in a superconducting state (e.g., when a current less than $I_{min}$ is applied to the device in forward bias, the device operates in a superconducting state; and when a current less than $I_{min}$ is applied to the device in reverse bias, the device also operates in a superconducting state). While a current between $I_{min}$ and $I_{max}$ is applied in forward bias, the device operates in a superconducting state; and while a current between $I_{min}$ and $I_{max}$ is applied in reverse bias, the device operates in a resistive state, thereby providing asymmetric conductance.

In some embodiments, $I_{min}$ is the threshold reverse bias current, which causes second channel 114-b to transition to a resistive state. In some embodiments, $I_{min}$ is the threshold reverse bias current, which causes both first channel 114-a and second channel 114-b to transition to a resistive state. In some embodiments, $I_{max}$ is the threshold forward bias current, which causes both channels (channel 114-a and channel 114-b) to transition to a resistive state (concurrently or sequentially).

To that end, frame 400-1 illustrates loop 112 with applied current in forward bias. In forward bias, current 402 is applied from first electrode 110-a to second electrode 110-b. While current 402 is applied from first electrode 110-a to the second electrode 110-b, a portion of current 402 is distributed through first channel 114-a (the portion distributed through first channel 114-a is labeled current 402-a) and a portion of current 402 is initially distributed through second channel 114-b (the portion distributed through second channel 114-b is labeled current 402-b). In some embodiments, current 402 is at least initially distributed equally between channel 114-a and channel 114-b, resulting in current 402-a and current 402-b being equal.

When forward bias current 402 has a magnitude in the range of current magnitudes ($I_{min}$, $I_{max}$), loop 112 remains in a superconducting state. To that end, first channel 114-a is configured (e.g., via the selection criteria) so that, when the current is applied from first electrode 110-a to second electrode 110-b (e.g., in forward bias), the portion of the current initially distributed through first channel 114-a (i.e., current 402-a), added to the expulsion current $I_E$ in first channel 114-a, results in a current density in first channel 114-a that remains below a critical current density of the superconducting material. Further, the portion of the current initially distributed through second channel 114-b (i.e., current 402-b), reduced by the expulsion current $I_E$ in second channel 114-b, results in a current density in second channel 114-b that remains below a critical current density of the superconducting material. By definition, these criteria remain valid for the maximum current in the range of current magnitudes. To that end, the maximum current Imax in the range of current magnitudes gives rise to the following selection rules:

$$\frac{I_E + 0.5 \times I_{max}}{A_1} = \frac{I_E + 0.5 \times I_{max}}{w_1 \times t} < j_c; \quad (1)$$

$$\frac{I_E - 0.5 \times I_{max}}{A_2} = \frac{I_E - 0.5 \times I_{max}}{w_2 \times t} < j_c; \quad (2)$$

where $I_E$ is the expulsion current (which varies with the applied magnetic field), $A_1$ is the cross-sectional area of the narrowest part (e.g., a part having a smallest cross-sectional area) of first channel 114-a, and $A_2$ is the cross-sectional area of the narrowest part (e.g., a part having a smallest cross-sectional area) of second channel 114-b. When the first channel and the second channel have a same thickness t of the layer of superconducting material (e.g., layer 108, FIG. 1A), $w_1$ is the first minimum width (e.g., the minimum width of first channel 114-a), and $w_2$ is the second minimum width (e.g., the minimum width of the second channel 114-b, which is less than the first minimum width). In some embodiments, the thickness of the layer of superconducting material varies between first channel 114-a and second channel 114-b, but a uniform thickness simplifies the process of manufacturing loop 112.

Frames 400-2 through 400-4 illustrate loop 112 in reverse bias, in which application of current 404 from second electrode 110-b to first electrode 110-a results in loop 112 transitioning to a resistive state (e.g., a non-superconducting state).

Frame 400-2 illustrates the moment current 404 greater than or equal to $I_{min}$ is applied to loop 112 in reverse bias. Initially, a portion of current 404 is distributed through first channel 114-a (the portion distributed through first channel 114-a is labeled current 404-a) and a portion of current 404 is distributed through second channel 114-b (the portion distributed through second channel 114-b is labeled current 404-b). In some embodiments, current 404 initially distributes equally between channel 114-a and channel 114-b, resulting in current 404-a and current 404-b being equal. Second channel 114-b is configured (e.g., by choice of shape and size, according the selection criteria) so that, when current 404 is applied (in reverse bias) from second electrode 110-b to first electrode 110-a, the portion of the current initially distributed through second channel 114-b (i.e., current 404-b), added to the expulsion current in second channel 114-b, results in a current density in second channel 114-b that exceeds a critical current density of the superconducting material. Because current 404 is above the minimum current $I_{min}$ in the range of current magnitudes, applied current 404 causes second channel 114-b (i.e., the narrower channel) to transition to a resistive state, as illustrated by resistive region 406 of channel 114-b as shown in frame 400-3. This requirement that second channel 114-b become resistive for a reverse bias current within the range of current magnitudes gives rise to the following selection rule.

$$\frac{I_E + 0.5 \times I_{min}}{A_2} = \frac{I_E + 0.5 \times I_{min}}{w_2 \times t} > j_c. \quad (3)$$

With channel 114-a in a superconducting state and channel 114-b in a resistive state, regardless of the channel 114-b's resistance, all or nearly all of the current 404 is redistributed. In addition, because channel 114-b of loop 112 is no longer superconducting (e.g., loop 112 has a resistive portion, namely channel 114-b), loop 112 no longer supports expulsion current $I_E$ (e.g., the expulsion current is dissipated as heat in resistive region 406).

When current 404 is redistributed to the remaining superconducting channel 114-a as shown in frame 400-3, current 404 causes an increase in the current density in channel 114-a. This continues the avalanche effect of switching loop 112 to a resistive state. To ensure that all or nearly all of current 404 is redistributed through the remaining superconducting channel 114-a (instead of redistributing through a portion of a larger circuit coupled with device 100, which may have a low impedance and thus tend to sink current), device 100 includes inductor 104 shown in FIG. 1. Inductor 104 (FIG. 1) is in series with loop 112 and thus limits the rate of change of the total current traveling from electrode 110-a to electrode 110-b (e.g., prevents a discontinuous change in the total current traveling from electrode 110-a to 110-b). In some embodiments, inductor 104 is coupled with electrode 110-a. In some embodiments, inductor 104 is coupled with electrode 110-b. In some embodiments, a first inductor is coupled with electrode 110-a and a second inductor that is distinct and separate from the first inductor is coupled with electrode 110-b.

The increased current density in channel 114-a (caused by the redistribution of current 404 from channel 114-b to channel 114-a) exceeds the critical current density. The result is an avalanche effect whereby channel 114-a transitions to a resistive state in response to channel 114-b transitioning to a resistive state (as illustrated by resistive region 408 in channel 114-a, frame 400-4). Thus, application of a reverse bias current within the range of current magnitudes causes the entire path between electrode 110-b and electrode 110-a to become resistive, resulting in the conductance asymmetry that gives rise to the device's operation as a diode. The cascade effect thus gives rise to the final selection rule:

$$\frac{I_{min}}{A_1} = \frac{I_{min}}{w_1 \times t} > j_c. \quad (4)$$

Frame 400-4 occurs a short time after frame 400-3. Frame 400-4 illustrates the final effect of the current on the state of loop 112, namely that both channel 114-*a* and channel 114-*b* have become resistive. In some embodiments, the resistive portion of channel 114-*b* is larger than it was in frame 400-3, which results from the residual currents in channel 114-*b* creating heat (because channel 114-*b* is now resistive) and raising an expanded portion of channel 114-*b* above the critical temperature.

In some circumstances, the selection rules are written as:

$$I_0 - I_E < I_C \leq I_0 + I_E; \quad (5)$$

$$I_0 + I_E < \frac{w_1}{w_2} I_C \leq 2 \times I_0; \quad (6)$$

$$I_E < I_C; \quad (7)$$

$$w_1 > w_2. \quad (8)$$

In Equations (5)-(8), $I_0$ is the current through each channel 114 and $I_C$ is the critical current for the narrow channel (e.g., channel 114-*b*). The range of applied currents $2 \times I_0$ under which Equations (5)-(8) hold true, given the device's geometry and specifications, provides the range of currents ($I_{min}$, $I_{max}$) in Equations (1)-(4). The left-hand inequalities in Equations (5)-(6) provide conditions for which the device remains superconducting under forward bias. The right-hand inequalities in Equations (5)-(6) provide conditions under which the device transitions to a resistive state in reverse bias. Equation (7) provides a maximum expulsion current, above which the expulsion current quenches the loop and causes it to become resistive even in the absence of an applied current. Equation (8) states that channel 114-*a* is the wider channel (vis-à-vis channel 114-*b*).

Figure 5:
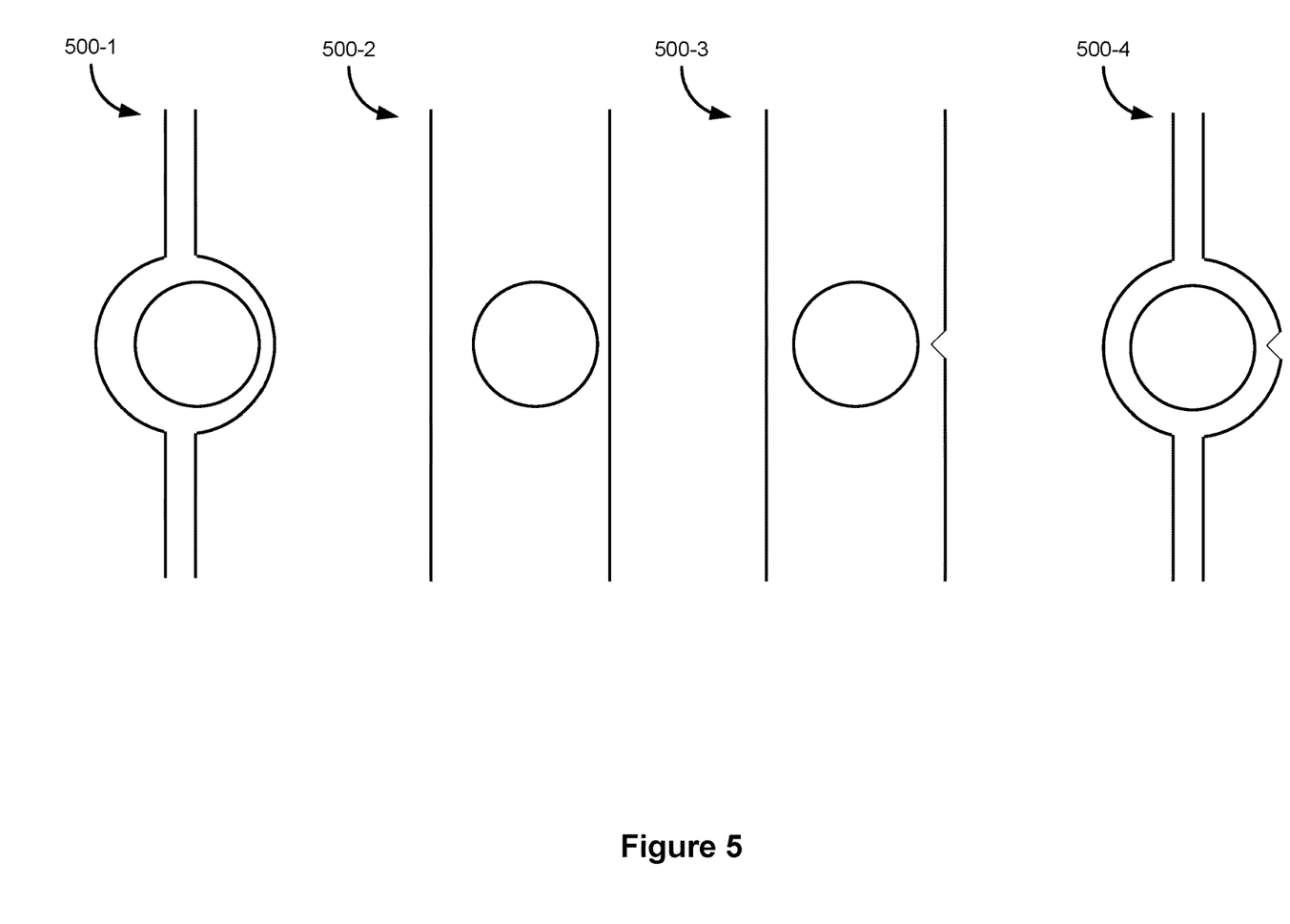
FIG. 5 illustrates example geometries of superconducting loops having a first channel and a second channel with different minimum widths in accordance with some embodiments.

FIG. 5 illustrates example geometries of superconducting loops 500 having a first channel and a second channel with differing minimum widths (e.g., the first channel has a first minimum width and the second channel has a second minimum width that is distinct from the first minimum width) in accordance with some embodiments. In accordance with some embodiments, each of loop 500-1 and loop 500-2 has a shape comprising an outer ellipse (e.g., circle) and an inner ellipse (e.g., circle) that is eccentric to the outer ellipse resulting in a first minimum width of the first channel and a second minimum width, distinct from the first minimum width, of the second channel. Thus, the eccentricity between the outer ellipse and the inner ellipse results in the different minimum widths of the first channel and the second channel. As used herein, the term ellipse includes an oval.

In accordance with some embodiments, as shown in loop 500-3 and loop 500-4, the second channel has a notch formed therein resulting in the second minimum width being less than the first minimum width (e.g., the patterned layer of superconducting material is patterned such that a notch of insulating material extends into the second channel, constricting the conductive path of the second channel and defining a minimum width of the second channel that is less than a minimum width of the first channel). In some embodiments, loop 500-4 is shaped by two concentric circles, where one side of the other circled has such a notch formed therein. In some embodiments, rather than ellipses, the first channel and the second channel are formed by rectangles (or any other shape). The rectangles can be off-center relative to one another (e.g., in an analogous fashion to the ellipses shown in loop 500-1 and loop 500-2), or one rectangle can include a constricting notch (e.g., in an analogous fashion to the constricting notches shown in loop 500-3 and loop 500-4), or both. In some embodiments, a first notch is defined in the first channel and a second notch is defined in the second channel so that a first minimum width of the first channel defined by the first notch is greater than a second minimum width of the second channel defined by the second notch. One of skill in the art will recognize numerous ways to pattern a layer of superconducting material so as to create two channels whereby the two channels have differing minimum widths.

Figure 6:
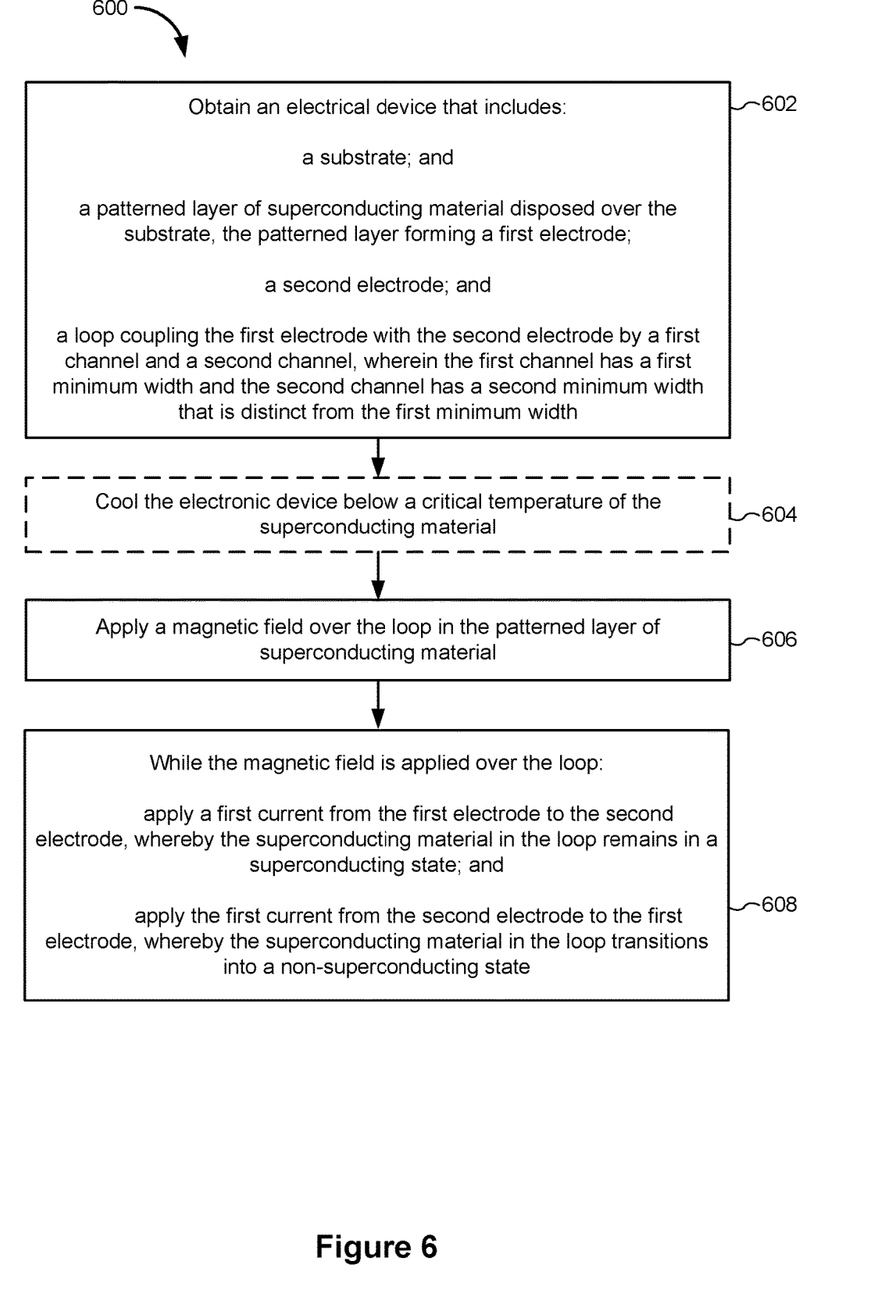
FIG. 6 illustrates a method using a diode device based on superconducting materials in accordance with some embodiments.

FIG. 6 illustrates method 600 of using an electrical device (e.g., diode device) based on superconducting materials, in accordance with some embodiments. The method includes obtaining (602) an electrical device that includes a substrate (e.g., substrate 106, FIG. 1A) and a patterned layer of superconducting material disposed over the substrate (e.g., patterned superconductor 108, FIGS. 1A-1B). The patterned layer forms a first electrode (e.g., electrode 110-*a*, FIG. 1B), a second electrode (e.g., electrode 110-*b*, FIG. 1B), and a loop coupling the first electrode with the second electrode by a first channel and a second channel (e.g., loop 112 couples electrode 110-*a* and electrode 110-*b* by channel 114-*a* and channel 114-*b*, FIG. 1B). The first channel has a first minimum width and the second channel has a second minimum width that is distinct from the first minimum width (e.g., as shown in FIGS. 1B, 2, 4, and 5). In some embodiments, the electronic device has any of the features described with reference to FIGS. 1A-1C through FIG. 5.

In some embodiments, method 600 includes cooling (604) (e.g., cryogenically) the electronic device below a critical temperature of the superconducting material. In some embodiments, the cooling is performed using any cooling technology that can reach the critical temperature of the superconducting material. For high-temperature superconductors, these technologies include cooling with liquid nitrogen. For lower-temperature superconductors, technologies such as dilution refrigeration, adiabatic demagnetization, and helium refrigeration can be used.

Method 600 includes applying (606) a magnetic field over the loop in the patterned layer of superconducting material. In some embodiments, the magnetic field has a predefined magnitude at the surface of the patterned layer of superconducting material. In some embodiments, the magnetic field is applied substantially perpendicularly to the patterned layer of superconducting material. In some embodiments, the magnetic field is applied using a magnet that is integrated with the electronic device (e.g., as shown in FIG. 1A and described with reference to FIGS. 3A-3B). In some embodiments, the magnetic field is applied using an external magnet.

Method 600 includes, while the magnetic field is applied over the loop: applying (608) a first current from the first electrode to the second electrode, whereby the superconducting material in the loop remains in a superconducting state, and applying the first current from the second electrode to the first electrode, whereby the superconducting material in the loop transitions into a non-superconducting state.

In some embodiments, method 600 includes tuning the magnetic field (e.g., tuning the magnitude of the magnetic field) to tune a range of current magnitudes for which the loop exhibits asymmetric conductance whereby the superconducting material in the loop remains in a superconducting state when the first current is applied from the first electrode to the second electrode and whereby the superconducting material in the loop transitions into a non-superconducting state when the first current is applied from the second electrode to the first electrode.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described implementations. The first current and the second current are both currents, but they are not the same current unless explicitly stated as such.

As used herein, the term "if" is, optionally, construed to mean "when" or "upon" or "in response to determining" or "in response to detecting" or "in accordance with a determination that," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. An electronic device, comprising:
   a substrate;
   a patterned layer of superconducting material disposed over the substrate, the patterned layer forming:
      a first electrode;
      a second electrode; and
      a loop coupling the first electrode with the second electrode by a first channel and a second channel, wherein the first channel has a first minimum width and the second channel has a second minimum width that is distinct from the first minimum width;
   a magnet configured to apply a magnetic field to the loop in the patterned layer of superconducting material, wherein the magnetic field produces an expulsion current in the loop that travels toward the second electrode in the first channel and toward the first electrode in the second channel;
   wherein, for a range of current magnitudes, when the magnetic field is applied to the patterned layer of superconducting material, the conductance from the first electrode to the second electrode is greater than the conductance from the second electrode to the first electrode.

2. The electronic device of claim 1, wherein:
   the first minimum width is greater than the second minimum width.

3. The electronic device of claim 2, wherein:
   the second channel is configured to transition to a resistive state upon application of a current from the second electrode to the first electrode having a magnitude in the range of current magnitudes.

4. The electronic device of claim 3, wherein:
   upon the application of the current from the second electrode to the first electrode, the first channel is configured to transition to a resistive state in response to the second channel transitioning to a resistive state.

5. The electronic device of claim 3, wherein:
   when the current is applied from the second electrode to the first electrode, a portion of the current is initially distributed through the second channel; and
   the second channel is configured so that, when the current is applied from the second electrode to the first electrode, the portion of the current initially distributed through the second channel, added to the expulsion current in the second channel, results in a current density in the second channel that exceeds a critical current density of the superconducting material.

6. The electronic device of claim 5, wherein:
   the second channel is configured so that, when the current is applied from the first electrode to the second electrode, the portion of the current initially distributed through the second channel, reduced by the expulsion current in the second channel, results in a current density in the second channel that remains below a critical current density of the superconducting material.

7. The electronic device of claim 1, wherein the loop has a shape comprising an outer ellipse and an inner ellipse that is eccentric to the outer ellipse resulting in the distinct first minimum width and the second minimum width of the first channel and the second channel, respectively.

8. The electronic device of claim 1, wherein the second channel has a notch formed therein resulting in the first minimum width being less than the second minimum width.

9. The electronic device of claim 1, wherein the magnet is an electromagnet.

10. The electronic device of claim 9, wherein the electromagnet is fabricated on the substrate to form an integral part of the electronic device, the electromagnet comprising:
    one or more coils of wire; and
    circuitry to provide current to the one or more coils of wire.

11. The electronic device of claim 9, wherein the electromagnet is configured to apply a tunable magnetic field to the patterned layer of superconducting material to tune the range of current magnitudes for which the conductance from the first electrode to the second electrode is greater than the conductance from the second electrode to the first electrode.

12. The electronic device of claim 1, wherein the magnet is a permanent magnet.

13. The electronic device of claim 12, wherein the permanent magnet comprises one or more magnetic layers disposed over the substrate, the one or more magnetic layers collectively having a perpendicular magnetic anisotropy.

14. The electronic device of claim 1, wherein the magnet is integrated with the electronic device on the substrate.

15. The electronic device of claim 1, further comprising an inductive element.

16. The electronic device of claim 1, wherein the electronic device is a two-terminal device.

17. A method, comprising:
obtaining an electronic device that includes:
- a substrate; and
- a patterned layer of superconducting material disposed over the substrate, the patterned layer forming:
  - a first electrode;
  - a second electrode; and
  - a loop coupling the first electrode with the second electrode by a first channel and a second channel, wherein the first channel has a first minimum width and the second channel has a second minimum width that is distinct from the first minimum width;

applying a magnetic field over the loop in the patterned layer of superconducting material; and while the magnetic field is applied over the loop:
- applying a first current from the first electrode to the second electrode, whereby the superconducting material in the loop remains in a superconducting state; and
- applying the first current from the second electrode to the first electrode, whereby the superconducting material in the loop transitions into a non-superconducting state.

* * * * *